United States Patent [19]
Nakamura

[11] Patent Number: 6,077,747
[45] Date of Patent: Jun. 20, 2000

[54] METHOD OF MANUFACTURING SEMICONDUCTOR DEVICE

[75] Inventor: Norio Nakamura, Tokyo, Japan

[73] Assignee: NEC Corporation, Tokyo, Japan

[21] Appl. No.: 09/134,533

[22] Filed: Aug. 14, 1998

[30] Foreign Application Priority Data

Aug. 26, 1997 [JP] Japan ................................... 9-229279

[51] Int. Cl.7 .............................................. H01L 21/336
[52] U.S. Cl. ........................................... 438/291; 438/305
[58] Field of Search .................................... 438/264, 269, 438/282, 289, 291, 298, 301, 302, 305

[56] References Cited

U.S. PATENT DOCUMENTS

| | | | |
|---|---|---|---|
| 5,082,794 | 1/1992 | Pfiester et al. | 437/40 |
| 5,374,574 | 12/1994 | Kwon | 437/44 |
| 5,374,575 | 12/1994 | Kim et al. | 437/44 |
| 5,534,447 | 7/1996 | Hong | 437/27 |
| 5,576,574 | 11/1996 | Hong | 257/408 |
| 5,597,752 | 1/1997 | Niwa | 437/47 |
| 5,686,321 | 11/1997 | Ko et al. | 437/29 |
| 5,698,461 | 12/1997 | Liu | 437/44 |
| 5,750,430 | 5/1998 | Son | 438/303 |
| 5,899,719 | 5/1999 | Hong | 438/289 |
| 5,904,530 | 5/1999 | Shin | 438/291 |

FOREIGN PATENT DOCUMENTS 63-129664  6/1988  Japan .

Primary Examiner—John F. Niebling
Assistant Examiner—Walter L. Lindsay, Jr.
Attorney, Agent, or Firm—McGinn & Gibb, P.C.

[57] ABSTRACT

In a semiconductor device manufacturing method, a gate insulating film (2), a first gate electrode forming material film (4), a first film (10) and a second film (11) are formed on a semiconductor substrate (1), then a channel region (3) is formed by doping the substrate (1) with impurities through an opening portion formed in the second film (11) which is formed at inner edge of an opening of the first film (10), then a second gate electrode forming material film (9) formed thereon is left within the opening portion of the second film (11) through etching back thereof, then a groove is formed by removing the second film (11) with the remaining film (9) and the first film (10) used as an etching mask, then a low-concentration impurity diffusion layer (12) and an impurity layer (13) of the opposite conduction type to that of the layer (12) are formed in the substrate (1), then a portion of the film (4) exposed at the bottom of the groove is removed, then a side wall (14) of insulating material is formed in the groove, then the films (10, 4) around the side wall (14) are removed, and then a source/drain diffusion layer (15) is formed by doping the substrate (1) with impurities with the remaining films (4, 9) and the side wall (14) used as a mask.

7 Claims, 6 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and particularly to a method of manufacturing a semiconductor device having a MOS transistor with reduced parasitic capacitance.

2. Description of the Related Art

A method of reducing the diffusion layer capacitance between a source/drain high-concentration impurity diffusion region of a MOS transistor and a substrate has been hitherto used to increase the operation speed of a CMOS transistor in a semiconductor device. In order to reduce the diffusion layer capacitance as described above, it is an effective means to reduce the substrate impurity concentration of a channel region, however, the substrate impurity concentration tends to increase more and more as the microstructure of the transistor is more enhanced. In such a condition, a method of restricting doping of impurities into a channel region during the process of forming a channel region of a transistor by a photolithography technique and doping channel ions into only an area where a gate electrode is formed has been hitherto proposed as a method of reducing the diffusion layer capacitance. Further, with respect to recent MOS transistors, in order to enhance the microstructure has been proposed a device structure (so-called pocket structure) in which impurities having the opposite conduction type to that of an LDD-structure or low-concentration impurity layer of a source/drain diffusion layer are doped just below the low-concentration impurity layer to prevent extension of a depletion layer around the source/drain diffusion layer, thereby suppressing a short channel effect. In this structure, existence of the impurities for the pocket also increases the capacitance of the drain diffusion layer, and thus there is used means of doping impurities having the opposite conduction type to that of the drain (source) diffusion layer only in the neighborhood of boundary of the gate-drain (source) diffusion layers.

This conventional technique will be described hereunder with reference to the accompanying drawings. FIGS. 1A to 1D are schematic diagrams showing the process of a conventional method of manufacturing a semiconductor device.

First, as shown in FIG. 1A, a desired well (not shown) and an element isolation region 18 are formed on a semiconductor substrate 1.

Subsequently, as shown in FIG. 1B, a mask 22 is formed by using the photolithography technique, and by using the mask, ion implantation is performed on the area corresponding to a gate electrode formation prearranged portion of the semiconductor substrate 1 (an area of the semiconductor substrate 1 where a gate electrode will be formed), thereby forming a channel region 3.

Subsequently, as shown in FIG. 1C, a gate insulating film 2 is formed, and a gate electrode material is deposited on the gate insulating film 2. A gate electrode 4' is formed at the position corresponding to the channel region 3 by the photolithography technique. The photolithography process of forming the gate electrode 4' needs a margin for positionally matching with the photolithography of the channel region 3 (first mask positioning margin).

Subsequently, as shown in FIG. 1D, a mask 23 is formed by using the photolithography technique, and ion implantation is performed by using the mask 23 and the gate electrode 4' as a mask to form on the semiconductor substrate 1 an LDD-structured low-concentration impurity diffusion layer 12 and an impurity (pocket impurities) layer 13 having the opposite conduction type for suppressing a depletion layer from extending into the inside of the substrate. As in the case of the formation of the gate electrode 4', the photolithography process of forming the mask 23 needs a margin for positionally matching with the photolithography used to form the channel region 3 (second mask positioning margin).

Subsequently, as shown in FIG. 2A, a side wall 14 which is formed of an insulating film is formed on the side surface of the gate electrode 4', and high-concentration impurities are doped into the semiconductor substrate 1 by the ion implantation technique using the gate electrode 4' and the side wall 14 as a mask to form source and drain 15 which correspond to a high-concentration impurity diffusion layer.

Subsequently, as shown in FIG. 2B, an insulating film 20' is formed on the structure formed as described above, and a contact hole 16 is formed in the insulating film 20' to form a wire 17 on the insulating film 20'.

As described above, in the conventional method of the semiconductor device having the MOS transistor, the first and second mask positioning margins are unavoidable on the actual manufacturing process among the process of forming the channel region 3, the process of forming the gate electrode 4' and the process of doping the pocket impurities to form the LDD low-concentration impurity diffusion layer.

In this condition, the overlap area between the source/drain diffusion layer and the channel region is increased due to the positioning margins, and the diffusion layer capacitance between the source/drain diffusion layer and the channel region 3 or the semiconductor substrate 1 is increased. As a result, the operation speed of an electric circuit of the semiconductor device is reduced. The positioning margins as described above are required even when the element is designed more minutely, and thus it is a great obstacle to increase of the operation speed due to miniaturization of the device.

SUMMARY OF THE INVENTION

Therefore, an object of the present invention is to reduce the source/drain diffusion layer capacitance in a semiconductor device having an LDD pocket structure.

Further, the present invention has another object to provide a semiconductor device manufacturing method which can enhance the microstructure of the element structure of a semiconductor device having an LDD pocket structure, and also reduce the source/drain diffusion layer capacitance thereof.

In order to attain the above object, according to the present invention, there is provided a semiconductor device manufacturing method characterized by comprising:

a step of forming a gate insulating film on a semiconductor substrate and forming a first gate electrode forming material film on the gate insulating film;

a step of forming a first film on the first gate electrode forming material film, and selectively removing a portion of the first film at which a gate electrode will be formed, thereby forming an open portion in the first film;

a step of forming a second film on the first gate electrode forming material film in the neighborhood of the inner side surface of the open portion of the first film to expose the area of the first gate electrode forming material film at the inside of the second film;

a step of doping impurities for a channel region into the semiconductor substrate by using the first film and the second film as a mask to form the channel region;

a step of forming a second gate electrode forming material film on the first gate electrode forming material film exposed at the inside of the second film;

a step of removing the second film by using the first film and the second gate electrode forming material film as a mask to form a groove between the first film and the second gate electrode forming material film and expose the area of the first gate electrode forming material film corresponding to the groove;

a step of doping impurities into the semiconductor substrate through the groove to form a low-concentration impurity diffusion layer;

a step of doping impurities having the opposite conduction type to the low-concentration impurity diffusion layer into the lower side of the low-concentration impurity diffusion layer in the semiconductor substrate;

a step of removing the first film remaining after the groove is formed, and removing a portion of the first gate electrode forming material film at an area other than below the second gate electrode forming material film;

a step of forming a side wall composed of an insulating film so as to cover the side surfaces of the second gate electrode forming material film and the first gate electrode forming material film remaining below the second gate electrode forming material film; and a step of doping high-concentration impurities into the semiconductor substrate by using the remaining first and second gate electrode forming material films and the side wall as a mask to form source and drain.

In the above-described semiconductor device manufacturing method, the step of forming the second film on the first gate electrode forming material film in the neighborhood of the inner side surface of the open portion of the first film to expose the area of the first gate electrode forming material film at the inside of the second film is performed by forming a layer of material of the second film on the exposed surface, etching back the layer of the material of the second film to leave the second film in the neighborhood of the inner side surface of the open portion of the first film and expose the area of the first gate electrode forming material film at the inside of the remaining second film.

In the above-described semiconductor device manufacturing method, the step of forming the side wall of the insulating film so as to cover the side surface of the second gate electrode forming material film and the first gate electrode forming material film remaining below the second gate electrode forming material film is performed by forming a layer of material of the insulating film on the exposed surface and etching back the layer of the material of the insulating film to leave the insulating film only in the area corresponding to the groove.

In the above-described semiconductor device manufacturing method, the layer of the material of the insulating film on the exposed surface is formed prior to the removal step of the first film remaining after the groove is formed and also prior to the removal step of the first gate electrode forming material film portion other than the area below the second gate electrode forming material film.

In the above-described semiconductor device manufacturing method, the layer of the material of the insulating film on the exposed surface is formed subsequently to the removal step of the first film remaining after the groove is formed and also subsequently to the removal step of the first gate electrode forming material film portion other than the area below the second gate electrode forming material film.

In the above-described semiconductor device manufacturing method, the step of doping the impurities into the semiconductor substrate through the groove to form the low-concentration impurity diffusion layer and the step of doping the impurities having the opposite conduction type to the low-concentration impurity diffusion layer into the lower side of the low-concentration impurity diffusion layer in the semiconductor substrate are performed while the first gate electrode forming material film exists in the area corresponding to the groove.

In the above-described semiconductor device manufacturing method, the step of doping the impurities into the semiconductor substrate through the groove to form the low-concentration impurity diffusion layer and the step of doping the impurities having the opposite conduction type to the low-concentration impurity diffusion layer into the lower side of the low-concentration impurity diffusion layer in the semiconductor substrate are performed after the first gate electrode forming material film is removed from the area corresponding to the groove.

As described above, the mask positioning margin as used in the prior art is not required, and the diffusion layer of the source and drain is brought into indispensable minimum contact with the diffusion layer of the impurities having the opposite conduction type to that of the LDD low-concentration impurities which are doped into the channel region and the bottom surface of the LDD low-concentration impurity diffusion layer. Therefore, even when the element structure is made minute, the junction capacitance can be reduced, and the parasitic capacitance of the MOS transistor can be reduced. As a result, the operation speed can be sufficiently increased even for a semiconductor device having a minute element structure of the high integration design. Further, a gate electrode having a double-layer structure having desired characteristics can be easily obtained.

DETAILED DESCRIPTION OF THE PREFERRED EMBODIMENTS

Preferred embodiments according to the present invention will be described with reference to the accompanying drawings.

FIGS. 3A to 3D, 4A to 4D and 5A to 5C are schematic cross-sectional views showing an embodiment of a semiconductor device manufacturing method according to the present invention.

Figure 1A:
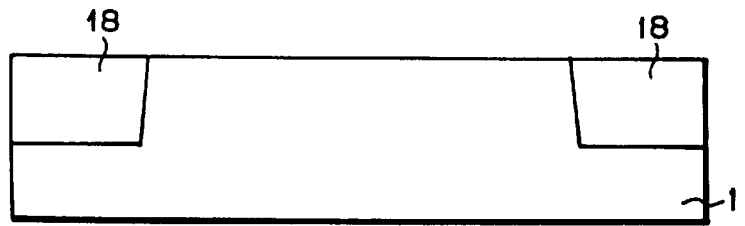
FIGS. 1A to 1D are schematic cross-sectional views showing a conventional semiconductor device manufacturing device.
Figure 1B:
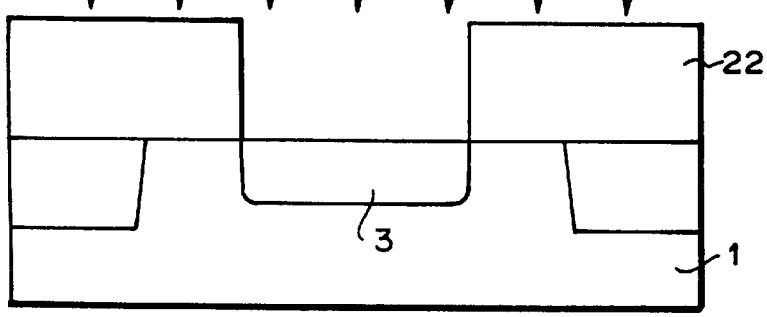
Figure 1C:
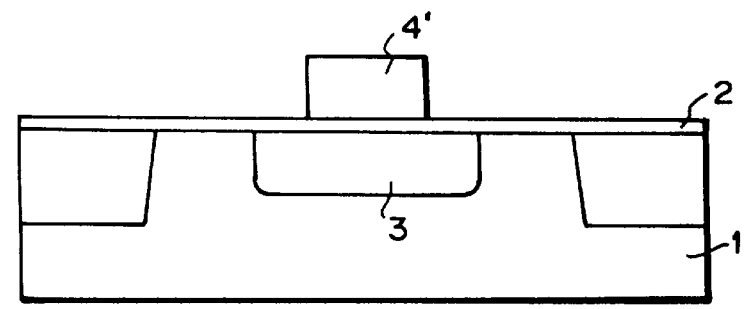
Figure 1D:
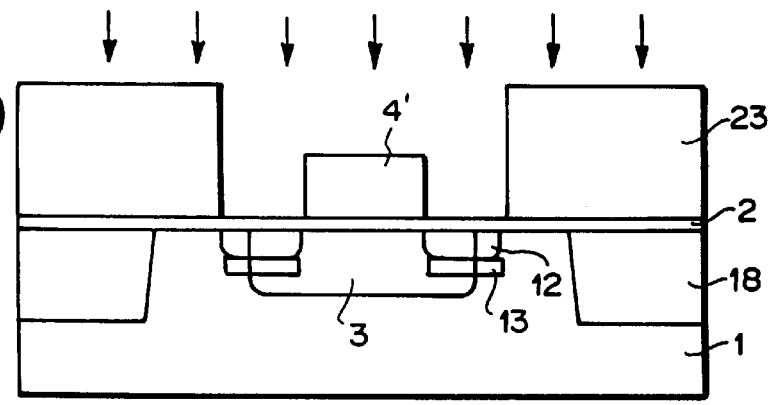
Figure 2A:
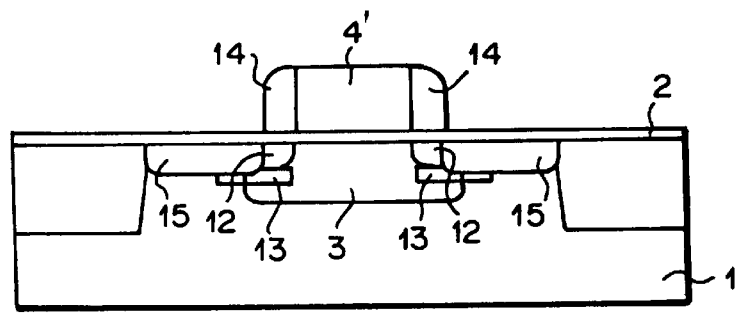
FIGS. 2A to 2B are schematic cross-sectional views showing the conventional semiconductor device manufacturing device.
Figure 2B:
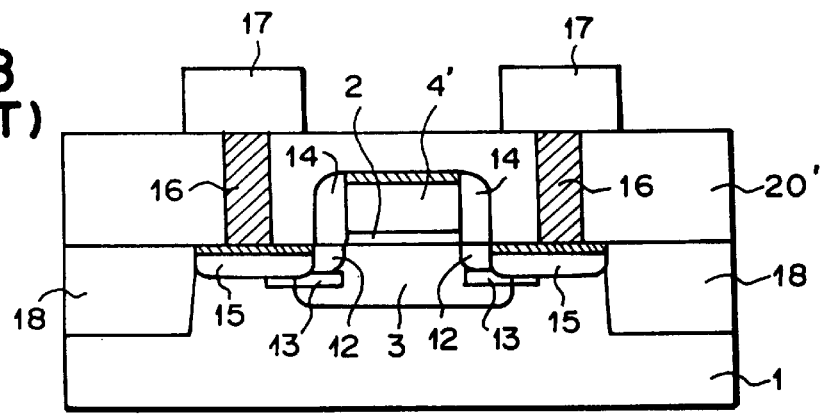
Figure 3A:
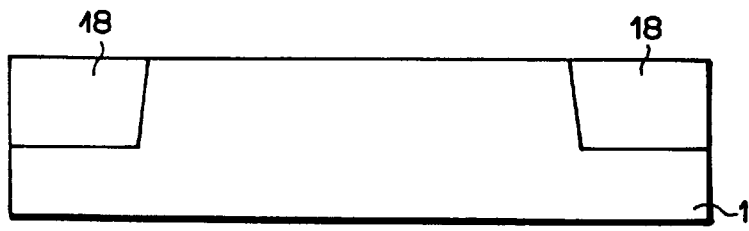
FIGS. 3A to 3D are schematic cross-sectional views showing an embodiment of a semiconductor device manufacturing method according to the present invention.

First, as shown in FIG. 3A, a desired well (not shown) and an element isolation region 18 are formed in a semiconductor (for example, silicon) substrate 1.

Figure 3B:
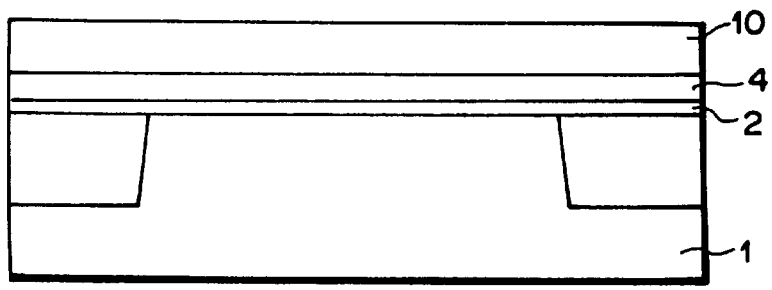

Subsequently, as shown in FIG. 3B, a gate insulating film (for example, a silicon oxide film) 2 is formed on the surface of the semiconductor substrate 1 (and the element isolation region 18), and a film 4 of a first gate electrode forming material (for example, polysilicon doped with phosphorus) is grown and formed at a thickness of about 500 to 1500 angstroms on the gate insulating film 2. Thereafter, a first film (for example, a silicon nitride film) 10 is formed at a thickness of about 2000 angstroms on the film 4.

Figure 3C:
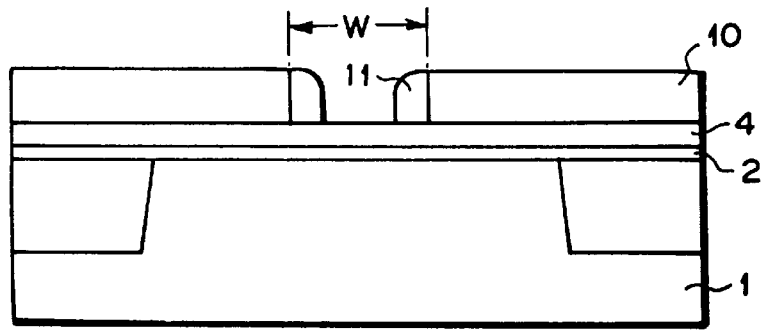

Subsequently, as shown in FIG. 3C, the area of the first film 10 corresponding to a gate electrode formation-prearranged area in which a gate electrode will be formed (that is, the gate electrode formation-prearranged portion and the surrounding portion) is selectively removed to form an open portion therein by the photolithography technique. Subsequently, a second film (for example, a silicon oxide film) 11 is grown and formed at a thickness of about 1500 angstroms on the structure thus formed, and the second film 11 is etched back. Accordingly, as shown in FIG. 3C, the second film 11 is left in the neighborhood of the inner side surface of the open portion of the first film 10 to form a side wall and expose to the outside the area of the first gate electrode forming material film 4 at the inside of the second film 11. Here, the width W of the open portion is preferably set to about twice of the gate length and the thickness of the second film 11.

Figure 3D:
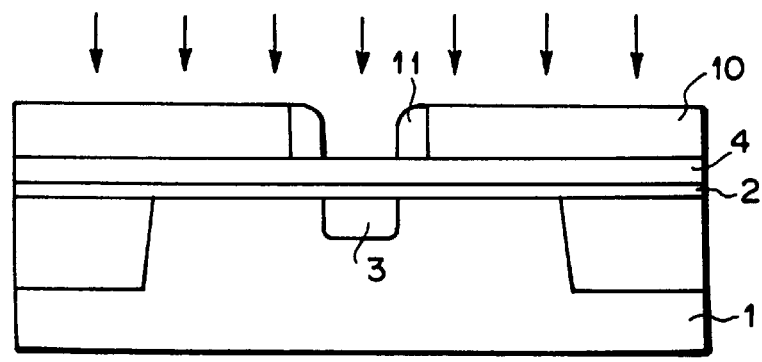

Subsequently, as shown in FIG. 3D, the ion implantation is performed by using the first film 10 and the second film 11 as a mask to introduce a second conduction type of impurities for a channel region into the semiconductor substrate 1, and then the substrate is annealed to form the channel region 3. The impurities are doped to determine a threshold voltage of the MOS transistor and suppress the short channel effect, and suitably selected in accordance with the transistor structure.

Figure 4A:
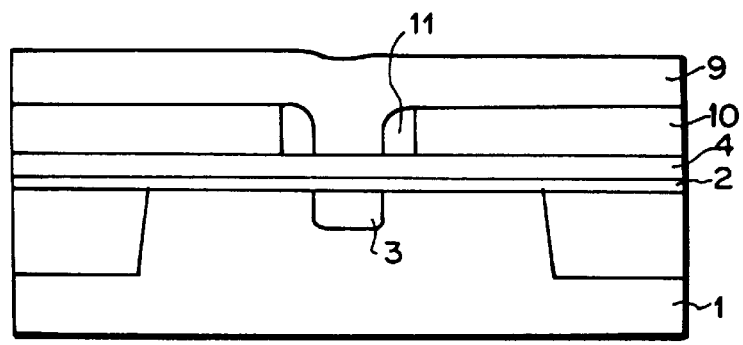
FIGS. 4A to 4D are schematic cross-sectional views showing the embodiment of the semiconductor device manufacturing method according to the present invention.

Subsequently, as shown in FIG. 4A, a film 9 of a second gate electrode forming material (for example, tungsten silicide: WSi) is grown and formed at a thickness of about 5000 angstroms on the structure thus formed. The preferable thickness of the second gate electrode forming material film 9 is strongly dependent on the width of the channel region determined by the open portion and the second film 11, and it is preferable that the film thickness is roughly set to about 1.5 time or more of the width of the channel region 3. As a result, the open portion is filled with the second gate electrode material.

Figure 4B:
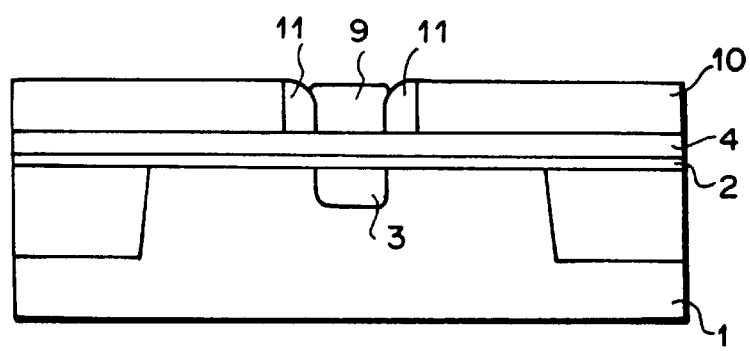

Subsequently, as shown in FIG. 4B, the second gate electrode forming material 9 is polished (for example, chemical polishing or chemical and mechanical polishing: CMP technique) until the first film 10 is exposed, whereby the second gate electrode forming material film 9 is partially removed so as to remain only in the inside of the second film 11 in the neighborhood of the inside of the open portion.

Figure 4C:
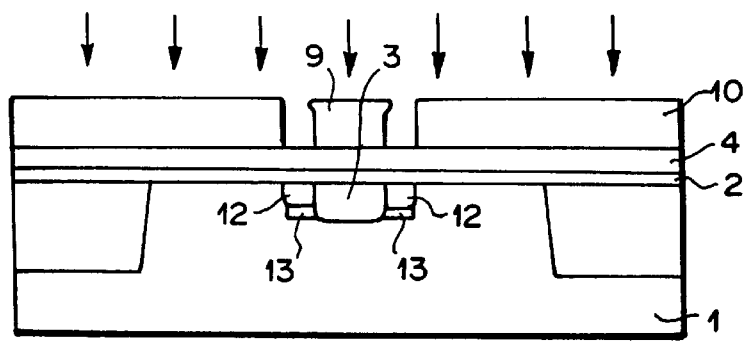

Subsequently, as shown in FIG. 4C, the second film 11 is etched by diluted HF by using the first film 10 and the second gate electrode forming material film 9 as a mask to remove the second film 11, whereby a groove is formed between the first film 10 and the second gate electrode forming material film 9, and the area of the first gate electrode forming material film 4 corresponding to the groove is exposed. The second conduction type impurities are doped through the groove into the semiconductor substrate 1 to form an LDD low-concentration impurity diffusion layer 12. Subsequently, impurities of first conduction type which is opposite to that of the low-concentration impurity diffusion layer 12 are doped into the semiconductor substrate 1 below the low-concentration impurity diffusion layer 12 to form an opposite conduction type impurity layer 13 so that it is brought into contact with the low-concentration impurity diffusion layer 12.

Figure 4D:
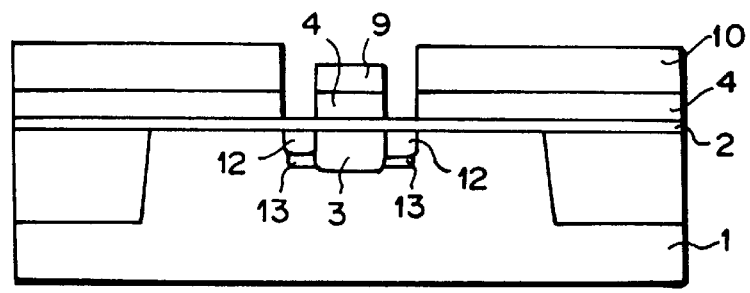

Subsequently, as shown in FIG. 4D, the area of the first gate electrode forming material film 4 corresponding to the groove is removed by the etching treatment. At this time, the second gate electrode forming material film 9 may be partially etched and removed.

Figure 5A:
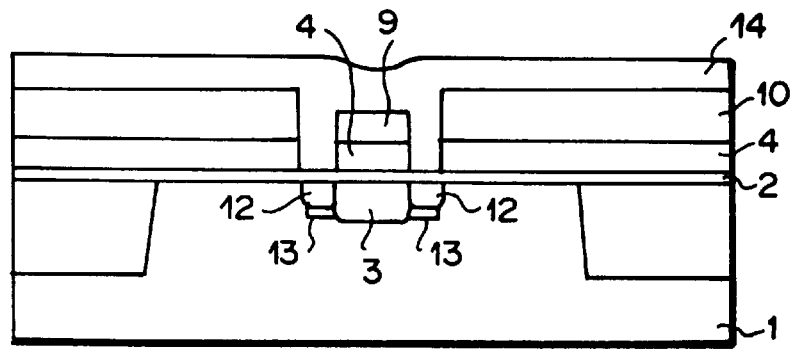
FIGS. 5A to 5C are schematic cross-sectional views showing the embodiment of the semiconductor device manufacturing method according to the present invention.

Subsequently, as shown in FIG. 5A, a first insulating film (for example, silicon oxide film) 14 is formed at a thickness of about 2000 angstroms.

Figure 5B:
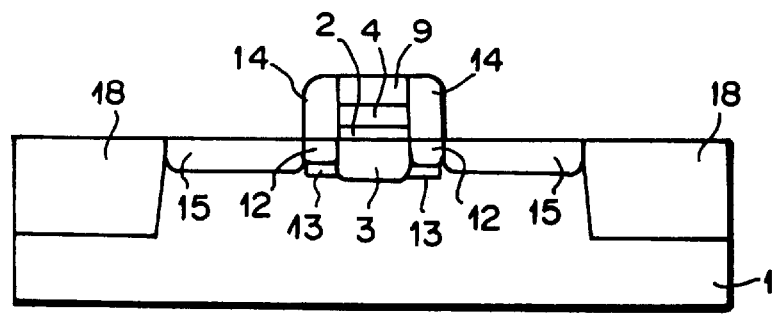

Subsequently, the first insulating film 14 is etched back, and as shown in FIG. 5B, the first insulating film 14 is left around the first and second gate electrode forming material films 4 and 9 in correspondence with the low-concentration impurity diffusion layer 12 to form a side wall. The remaining first film 10 is removed by the etching technique, and the first gate electrode forming material film 4 thus exposed is removed by the etching technique. The high-concentration first conduction type impurities are doped into the semiconductor substrate by the ion implantation technique using the remaining first and second gate electrode forming material films 4 and 9 and the remaining first insulating film (side wall) 14 as a mask, thereby forming source and drain 15 as a high-concentration impurity diffusion layer. Thereafter, it is subjected to a suitable anneal treatment (for example, at 1000° C. and for 10 seconds by RTA).

Figure 5C:
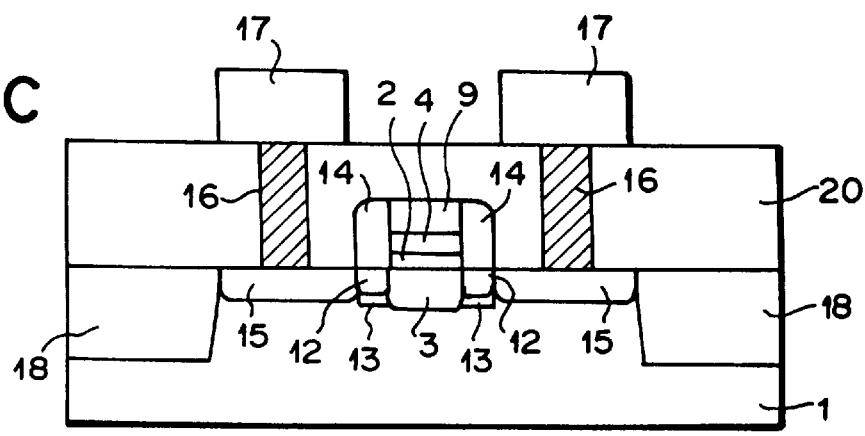

Subsequently, as shown in FIG. 5C, a second insulating film 20 is formed on the structure thus formed by a general method, a contact hole 16 is formed in the second insulating film 20, and a wire 17 is formed on the second insulating film 20. The wire 17 is connected to the source and drain 15 through the contact hole 16. Through the above process, an LSI semiconductor device is obtained.

As described above, in this embodiment, all of the low-concentration impurity diffusion layer 12, the opposite conduction type impurity layer 13 and the side wall 14 are positionally accurately formed in the area where the groove is formed, and the source and drain 15 are positionally accurately formed at the outside of the side wall 14. Therefore, the source and drain 15, and the low-concentration impurity diffusion layer 12 and the opposite conduction type impurity layer 13, and the channel region 3 are disposed at desired positions so that the neighbors are brought into indispensable minimum contact with each other. Accordingly, even when the element structure is made minute in the semiconductor device having the LDD pocket structure, the capacitance of the source/drain diffusion layer of the MOS transistor can be sufficiently reduced, and thus the operation speed of the semiconductor device can be increased.

Further, in this embodiment, the first gate electrode forming material film 4 and the second gate electrode forming material film 9 are used to form the gate electrode, and thus the second gate electrode forming material film 9 protect the first gate electrode forming material film 4 in the gate forming area during the step of partially removing the first gate electrode forming material film 4, and the gate electrode of two-layered structure having desired characteristics can be easily obtained.

In the above process, the step of forming the low-concentration impurity diffusion layer 12 and the impurity layer 13 having the opposite conduction type to that of the low-concentration impurity diffusion layer 12 as shown in FIG. 4C and the step of etching the first gate electrode forming material film 4 as shown in FIG. 4D may be performed in the reverse order.

Further, in the foregoing description, polysilicon is used as the first gate electrode material and WSi is used as the second gate electrode material. However, in place of these materials, Mo, W, Ta, Si or other silicide materials may be used as these electrode materials. The first electrode forming material and the second electrode forming material may be the same material (for example, polysilicon).

Still further, in the foregoing description, the first film and the second film are formed of insulating films. However, these films may be formed of W, TiN or other metal films.

FIGS. 6A to 6D are schematic cross-sectional views showing another embodiment of the semiconductor device manufacturing method of the present invention.

Figure 6A:
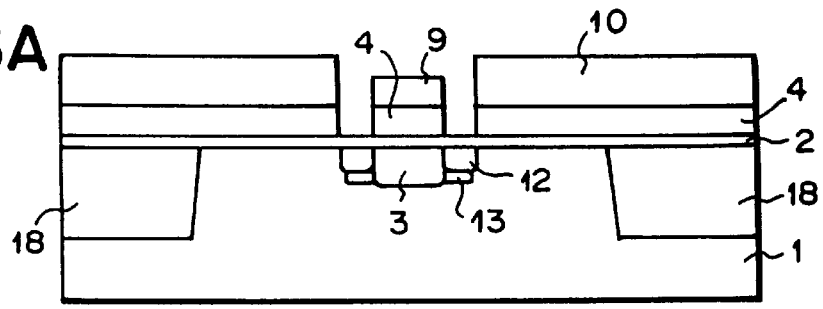
FIGS. 6A to 6D are schematic cross-sectional views showing another embodiment of the semiconductor device manufacturing method according to the present invention.

In this embodiment, the same steps as described with reference to FIGS. 3A to 3D and 4A to 4D are performed, whereby the structure shown in FIG. 6A is obtained.

Figure 6B:
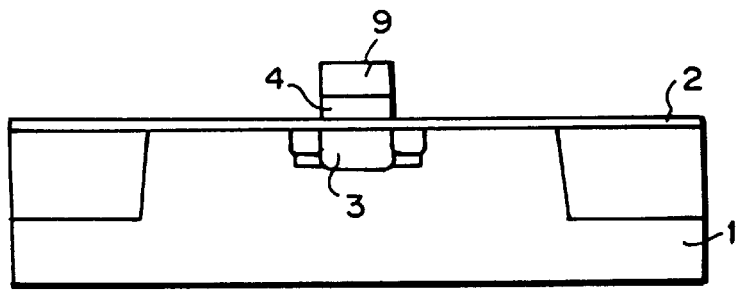
Figure 6C:
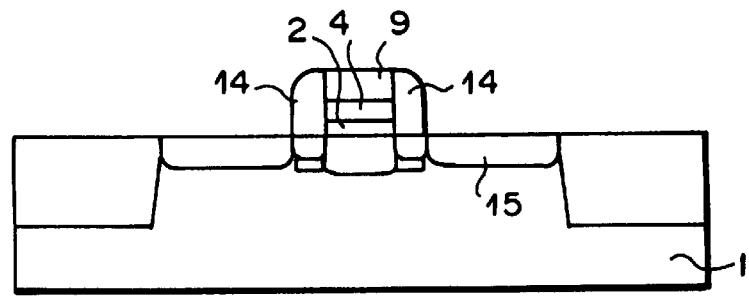

Subsequently, as shown in FIG. 6B, the remaining first film 10 is removed by the etching technique, and then the first gate electrode forming material film 4 thus exposed is removed by the etching technique.

In place of the above step, it may be adopted that after the same steps as described with reference to FIGS. 3A to 3D and 4A to 4C, the remaining first film 10 is removed by the etching technique and then the exposed first gate electrode forming material 4 is removed by the etching technique.

Subsequently, a first insulating film (for example, silicon oxide film) is formed at a thickness of about 1000 angstroms, and then etched back so that the first insulating film is left around the first and second gate electrode forming material films 4, 9 in correspondence with the low-concentration impurity diffusion layer 12, thereby forming a side wall 14. Thereafter, high-concentration first conduction type impurities are doped into the semiconductor substrate 1 by the ion implantation technique using the remaining first and second gate electrode forming material films 4, 9 and the remaining first insulating film (side wall) 14 as a mask, thereby forming source and drain 15 which are a high-concentration impurity diffusion layer. Thereafter, the result is subjected to an appropriate anneal treatment (for example, an anneal treatment at 1000° C. and for 10 seconds by RTA).

Figure 6D:
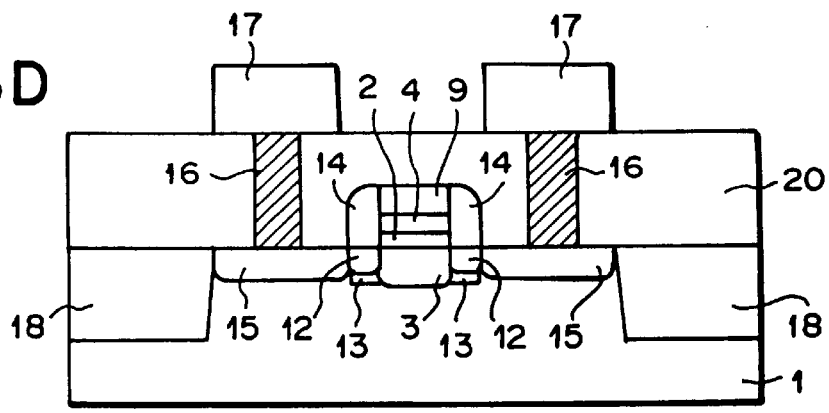

Subsequently, a second insulating film 20 is formed on the structure thus formed by a general method as shown in FIG. 6D, a contact hole 16 is formed in the second insulating film 20 and a wire 17 is formed on the second insulating film 20. The wire 17 is connected to the source and drain 15 through the contact hole 16, thereby obtaining the LSI semiconductor device.

In this embodiment, the low-concentration impurity diffusion layer 12 and the opposite conduction type impurity layer 13 are formed in accurate correspondence with the area where the groove is formed, the side wall 14 is formed in accurate correspondence with the area where the groove is formed, and the source and drain 15 are formed in accurate correspondence with the outside area of the side wall 14. Therefore, the source and drain 15, and the low-concentration impurity diffusion layer 12 and the opposite conduction type impurity layer 13, and the channel region 3 are disposed at desired positions so that the neighbors thereof are brought into indispensable minimum contact with each other. Accordingly, even when the element structure is made minute in the semiconductor device having the LDD pocket structure, the capacitance of the source/drain diffusion layer of the MOS transistor can be reduced, and the operation speed of the semiconductor device can be increased.

Further, in this embodiment, the first gate electrode forming material film 4 and the second gate electrode forming material film 9 are used to form the gate electrode. Therefore, the second gate electrode forming material film 9 protects the first gate electrode forming material film 4 in the gate forming area during the step of partially removing the first gate electrode forming material film 4, and the gate electrode of double-layer structure which has desired characteristics can be easily obtained.

As described above, according to the present invention, the low-concentration impurity diffusion layer and the opposite conduction type impurity layer are formed in accurate correspondence with the area where the groove is formed, the side wall is formed in accurate correspondence with the area where the groove is formed, and the source and drain are formed in accurate correspondence with the outside area of the side wall. Therefore, the source and drain, and the low-concentration impurity diffusion layer and the opposite conduction type impurity layer and the channel region are disposed at desired positions so that the neighbors thereof are brought into indispensable minimum contact with each other. Accordingly, even when the element structure is made minute in the semiconductor device having the LDD pocket structure, the capacitance of the source/drain diffusion layer of the MOS transistor can be reduced, and the operation speed of the semiconductor device can be increased.

Accordingly, it is unnecessary to pay attention to all of the positioning margin for the formation of the channel region and the gate electrode and the positioning margin for the formation of the opposite conduction type impurity layer and the gate electrode, so that both the reduction of the source/drain diffusion layer capacitance of the MOS transistor and the compact design can be achieved in the semiconductor device having the LDD pocket structure without reducing the manufacturing yield.

Further, according to the present invention, the first gate electrode forming material film and the second gate electrode forming material film are used to form the gate electrode. Therefore, the second gate electrode forming material film protects the first gate electrode forming material film in the gate forming area during the step of partially removing the first gate electrode forming material film, and the gate electrode of double-layer structure which has desired characteristics can be easily obtained.

What is claimed is:

1. A semiconductor device manufacturing method comprising:

a step of forming a gate insulating film on a semiconductor substrate and forming a first gate electrode forming material film on the gate insulating film;

a step of forming a first film on the first gate electrode forming material film, and selectively removing a portion of the first film at which a gate electrode will be formed, thereby forming an open portion in the first film;

a step of forming a second film on the first gate electrode forming material film in the neighborhood of the inner side surface of the open portion of the first film to expose the area of the first gate electrode forming material film at the inside of the second film;

a step of doping impurities for a channel region into the semiconductor substrate by using the first film and the second film as a mask to form the channel region;

a step of forming a second gate electrode forming material film on the first gate electrode forming material film exposed at the inside of the second film;

a step of removing the second film by using the first film and the second gate electrode forming material film as a mask to form a groove between the first film and the second gate electrode forming material film and expose the area of the first gate electrode forming material film corresponding to the groove;

a step of doping impurities into the semiconductor substrate through the groove to form a low-concentration impurity diffusion layer;

a step of doping impurities having the opposite conduction type to the low-concentration impurity diffusion layer into the lower side of the low-concentration impurity diffusion layer in the semiconductor substrate;

a step of removing the first film remaining after the groove is formed, and removing a portion of the first gate electrode forming material film at an area other than below the second gate electrode forming material film;

a step of forming a side wall composed of an insulating film so as to cover a side surface of the second gate electrode forming material film and the first gate electrode forming material film remaining below the second gate electrode forming material film; and a step of doping high-concentration impurities into the semiconductor substrate by using the remaining first and second gate electrode forming material films and the side wall as a mask to form source and drain.

2. The semiconductor device manufacturing method as claimed in claim 1, wherein said step of forming the second film on the first gate electrode forming material film in the neighborhood of the inner side surface of the open portion of the first film and exposing the area of the first gate electrode forming material film at the inside of the second film is performed by forming a layer of material of the second film on the exposed surface, etching back the layer of the material of the second film to leave the second film in the neighborhood of the inner side surface of the open portion of the first film and expose the area of the first gate electrode forming material film at the inside of the remaining second film.

3. The semiconductor device manufacturing method as claimed in claim 1, wherein said step of forming the side wall of the insulating film so as to cover the side surface of the second gate electrode forming material film and the first gate electrode forming material film remaining below the second gate electrode forming material film is performed by forming a layer of material of the insulating film on the exposed surface and etching back the layer of the material of the insulating film to leave the insulating film only in the area corresponding to the groove.

4. The semiconductor device manufacturing method as claimed in claim 3, wherein the layer of the material of the insulating film on the exposed surface is formed prior to said removal step of the first film remaining after the groove is formed, and also prior to said removal step of the first gate electrode forming material film portion other than the area below the second gate electrode forming material film.

5. The semiconductor device manufacturing method as claimed in claim 3, wherein the layer of the material of the insulating film on the exposed surface is formed subsequently to said removal step of the first film remaining after the groove is formed, and also subsequently to said removal step of the first gate electrode forming material film portion other than the area below the second gate electrode forming material film.

6. The semiconductor device manufacturing method as claimed in claim 1, wherein said step of doping the impurities into the semiconductor substrate through the groove to form the low-concentration impurity diffusion layer and said step of doping the impurities having the opposite conduction type to the low-concentration impurity diffusion layer into the lower side of the low-concentration impurity diffusion layer in the semiconductor substrate are performed while the first gate electrode forming material film exists in the area corresponding to the groove.

7. The semiconductor device manufacturing method as claimed in claim 1, wherein said step of doping the impurities into the semiconductor substrate through the groove to form the low-concentration impurity diffusion layer and said step of doping the impurities having the opposite conduction type to the low-concentration impurity diffusion layer into the lower side of the low-concentration impurity diffusion layer in the semiconductor substrate are performed after the first gate electrode forming material film is removed from the area corresponding to the groove.

* * * * *